(12) United States Patent
Ito

(10) Patent No.: US 6,608,747 B1
(45) Date of Patent: Aug. 19, 2003

(54) VARIABLE-CAPACITANCE DEVICE AND VOLTAGE-CONTROLLED OSCILLATOR

(75) Inventor: Shuji Ito, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/254,653

(22) Filed: Sep. 26, 2002

(51) Int. Cl.[7] .............................................. H01L 29/93
(52) U.S. Cl. ........................ 361/277; 257/595; 257/596
(58) Field of Search .......................... 361/277; 257/596, 257/379, 356, 595, 532; 438/217, 301, 218

(56) References Cited

U.S. PATENT DOCUMENTS 6,228,696 B1 * 5/2001 Nguyen et al. ............. 438/217
6,492,244 B1 * 12/2002 Christensen et al. ........ 438/404
2001/0000414 A1 * 4/2001 Fukayama et al. .......... 257/596
2002/0050867 A1 * 5/2002 Kato et al. ............... 331/116 R

* cited by examiner

*Primary Examiner*—Anthony Dinkins
(74) *Attorney, Agent, or Firm*—Volentine Francos, PLLC

(57) ABSTRACT

A variable-capacitance device includes first and second variable-capacitance elements which are connected in parallel to each other. Each of the first and variable-capacitance elements include gate, source and drain regions and operates in response to a control voltage applied to the gate region. The first and second variable-capacitance elements have different levels of threshold values.

6 Claims, 12 Drawing Sheets

Fig. 1
*Prior Art*
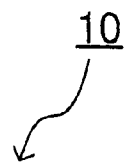
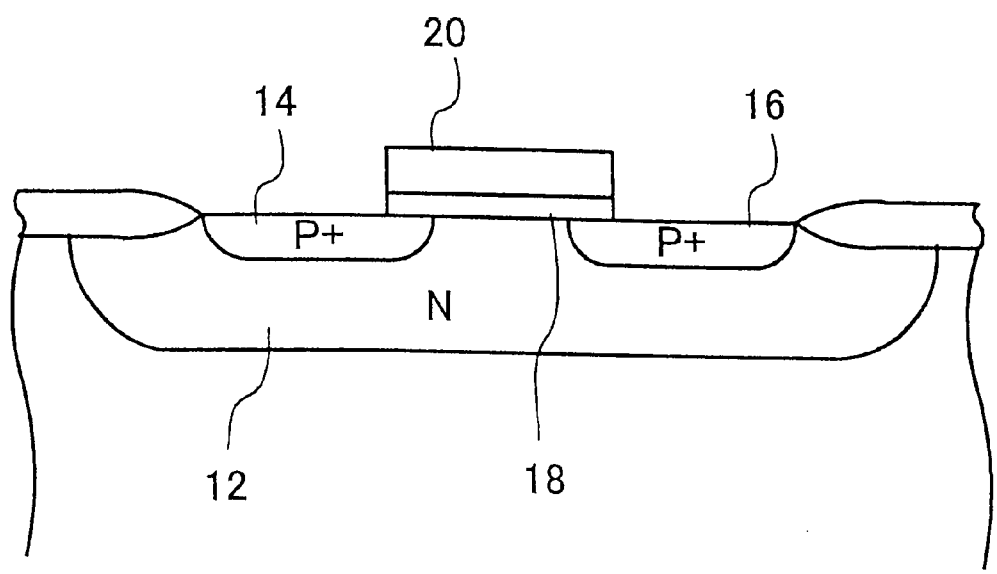

US 6,608,747 B1

VARIABLE-CAPACITANCE DEVICE AND VOLTAGE-CONTROLLED OSCILLATOR

TECHNICAL FIELD OF THE -INVENTION

The present invention relates generally to a variable-capacitance device and a voltage-controlled oscillator using the same.

BACKGROUND OF THE INVENTION

A conventional variable-capacitance device of MOS type includes an N-well region; P+ or N+ type of source and drain regions, an oxide layer and a gate electrode. The P+ source and drain regions are formed in the N-well region. When a control voltage, which is higher than a threshold value of the device, is applied to the gate electrode, a channel is formed and a capacitor area is increased. The capacity of the device can be controlled by adjusting a voltage applied to the gate electrode.

When a channel area is changed in size, the gradient (rate of change) of variable capacity is changed. The gradient of variable capacity is changed when channel area is changed. When a channel area is small, the gradient of variable capacity is smaller or gentle. On the other hand, when a channel area is large, the gradient of variable capacity is larger or steep.

As described above, a variable range is changed when a gradient (rate of change) of variable capacity is changed. In other words, when a gradient of variable capacity is decreased, a variable range is decreased as well. On the other hand, when a gradient of variable capacity is increased, a variable range is increased as well. Namely, it is difficult to control a gradient of variable capacity without changing a variable range of capacity.

OBJECTS OF THE INVENTION

Accordingly, it is an object of the present invention to provide a variable-capacitance device, in which the gradient (rate of change) of variable capacity can be controlled without change of variable range.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a variable-capacitance device includes first and second variable-capacitance elements which are connected in parallel to each other. Each of the first and second variable-capacitance elements include gate, source and drain regions and operates in response to a control voltage applied to the gate region. The first and second variable-capacitance elements have different threshold values.

The first and second variable-capacitance elements may be formed by fabrication steps comprising implanting impurities into a semiconductor substrate. The threshold values of the first and second variable-capacitance elements can be adjusted by controlling an amount of impurities to be implanted into the semiconductor substrate. According to another aspect of the present invention, the threshold values of the first and second variable-capacitance elements are adjusted by controlling lengths of the gate regions (electrodes).

BRIEF DESCRIPTION OF THE DRAWINGS

FIG. 1 is a cross-sectional view showing a first conventional type of variable-capacitance device.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 2:
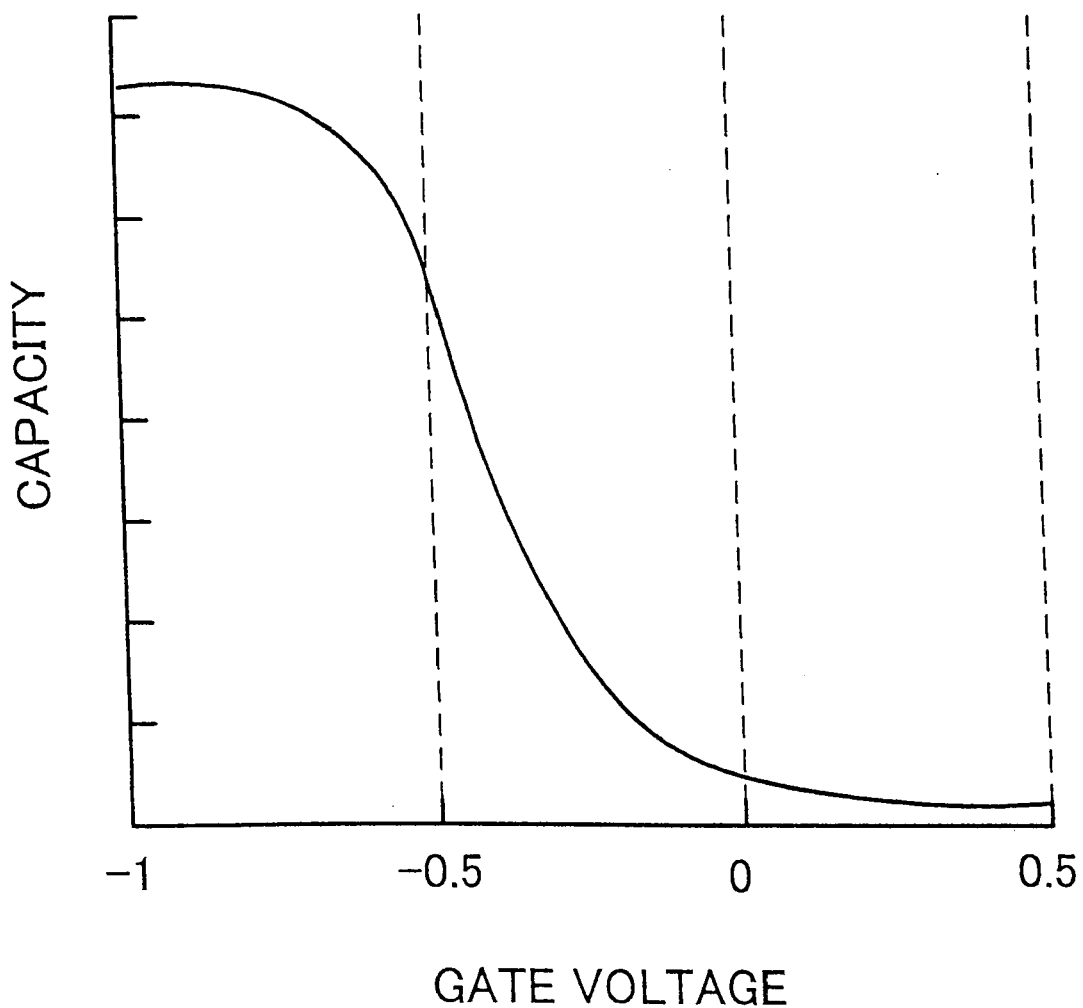
FIG. 2 is a graph showing a characteristic of the variable-capacitance device, shown in FIG. 1.

For better understanding of the present invention, conventional technology is first described in conjunction with FIGS. 1–5. FIG. 1 shows a conventional variable-capacitive device 10, which includes an N-well region 12, P+ type of source and drain regions 14 and 16, an oxide layer 18 and a gate electrode 20. The variable-capacitive device 10 is of a MOS type. The P+ source and drain regions 14 and 16 are formed in the N-well region 12. When a control voltage that is higher than a threshold value of the device is applied thereto, a channel is formed and a capacitor area is increased, as shown in FIG. 2.

Figure 3:
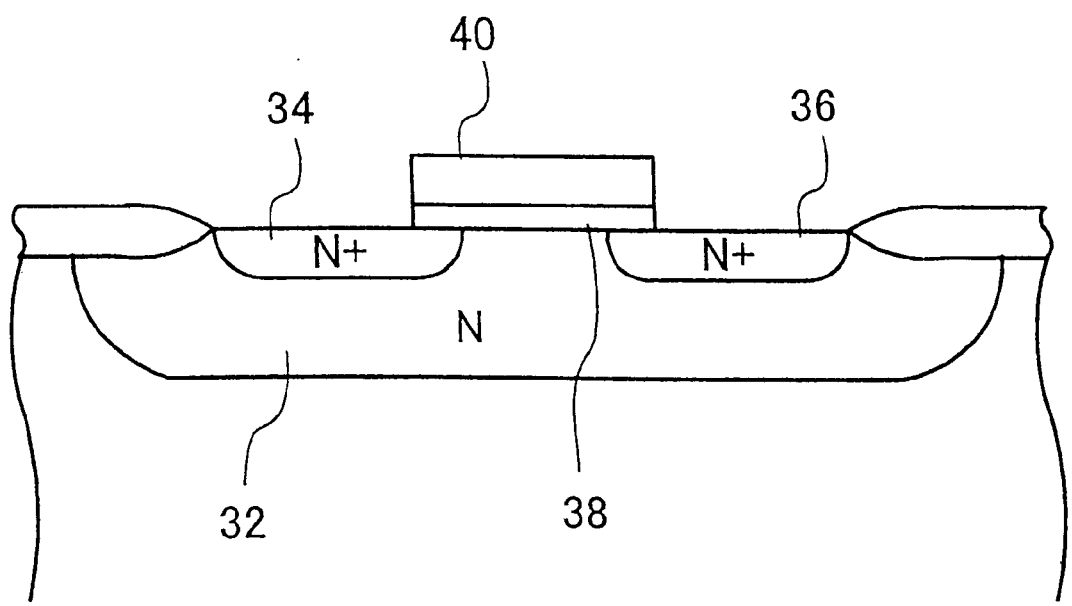
FIG. 3 is a cross-sectional view showing a second conventional type of variable-capacitance device.
Figure 4:
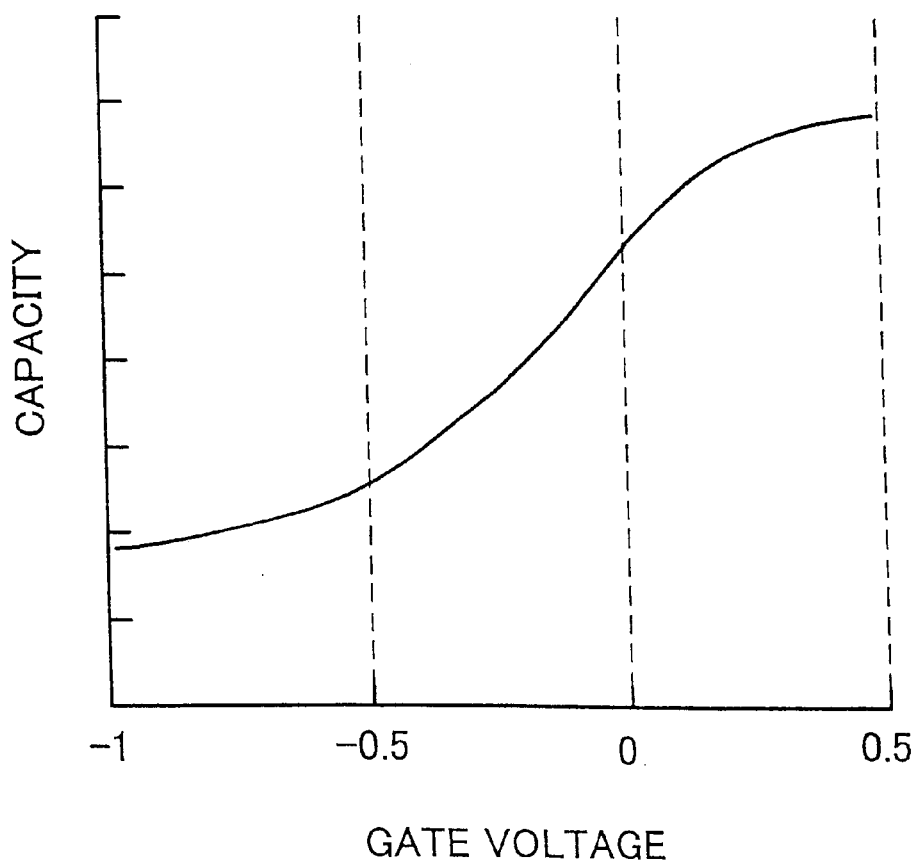
FIG. 4 is a graph showing a characteristic of the variable-capacitance device, shown in FIG. 3.

FIG. 3 shows another type of conventional variable-capacitive device 30, which includes an N-well region 32, N+ type of source and drain regions 34 and 36, an oxide layer 38 and a gate electrode 40. The variable-capacitive device 30 is of a MOS type. The N+ source and drain regions 34 and 36 are formed in the N-well region 32. The capacity of the device 30 can be controlled by adjusting a voltage applied to the gate electrode 40, as shown in FIG. 4.

Figure 5:
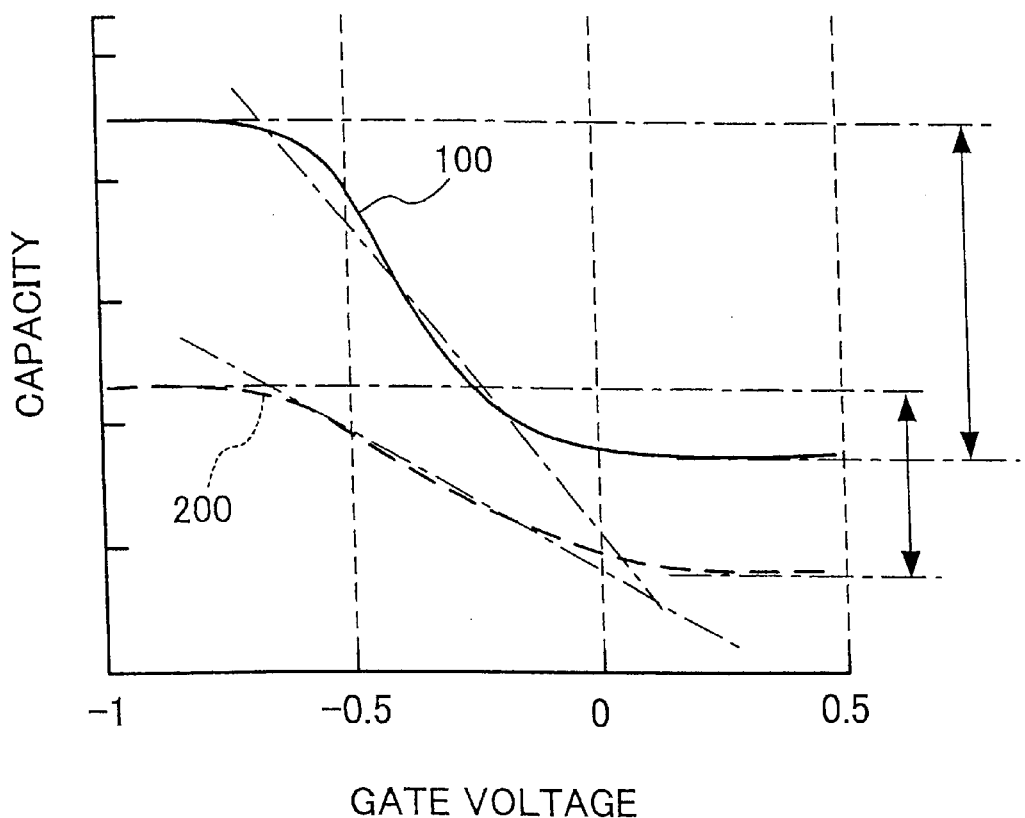
FIG. 5 is a graph showing a characteristic of a conventional variable-capacitance device.

When an area of channel is changed in size, the gradient (rate of change) of variable capacity is changed. As shown in FIG. 5, when channel areas are different between lines 100 and 200, the gradient of variable capacity are different from each other as well. A range of gate voltage is usually fixed, for example, in 1.5V. When a channel area is small in size, as shown by the line 200, the gradient of variable capacity is smaller or gentle. On the other hand, when a channel area is large in size, as shown by the line 100, the gradient of variable capacity is larger or steep.

As described above, a variable range is changed when a gradient (rate of change) of variable capacity is changed. In other words, when a gradient of variable capacity is decreased, a variable range is decreased as well. On the other hand, when a gradient of variable capacity is increased, a variable range is increased as well. Namely, it is difficult to control a gradient of variable capacity without changing a variable range of capacity.

Figure 6:
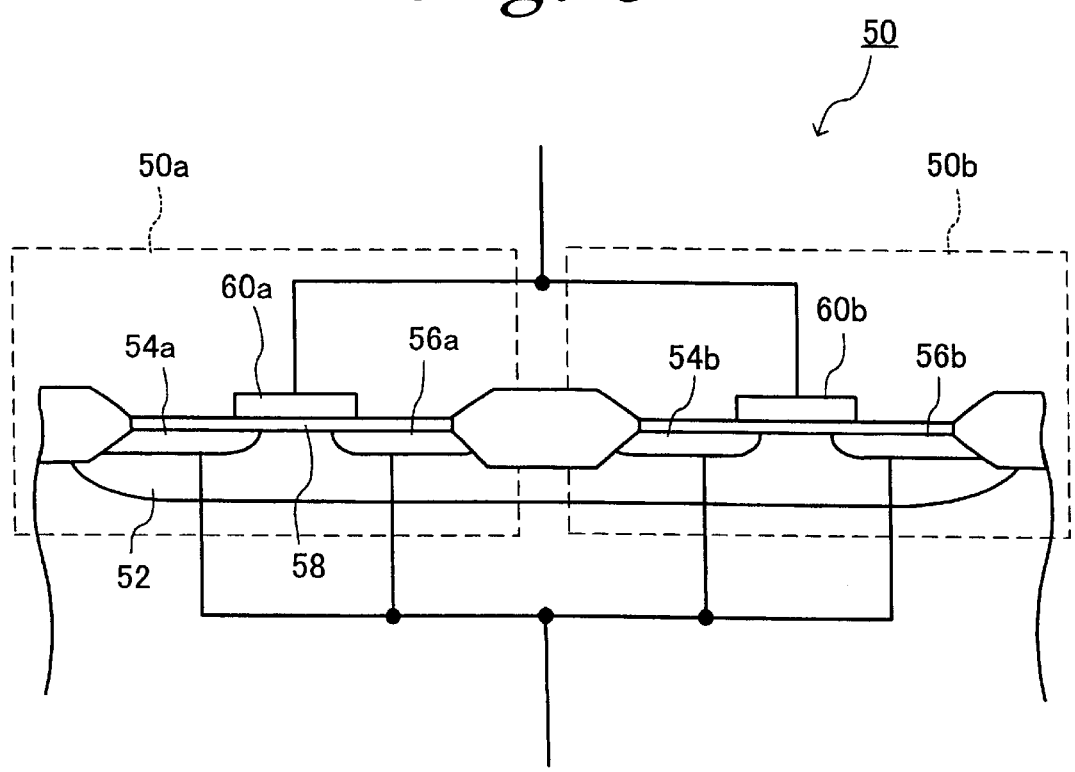
FIG. 6 is a cross-sectional view showing a variable-capacitance device according to a first preferred embodiment of the present invention.

FIG. 6 shows a variable-capacitance device 50 according to a first preferred embodiment of the present invention. The variable-capacitance device 50 includes first and second variable-capacitance elements 50a and 50b, which are connected in parallel to each other. Each of the first and second variable-capacitance elements 50a and 50b is of MOS-transistor type.

The first variable-capacitance element 50a includes a N-well region 52 formed in a P-type semiconductor substrate 64 (see FIGS. 7A–7D), P+ type of source and drain regions 54a and 56a, and a gate electrode 60a. The gate electrode 60a is formed on a gate-insulating layer 58a, which is formed on the N-well region 52a.

The second variable-capacitance element 50b includes the N-well region 52, which is commonly used with the first variable-capacitance element 50a, P+ type of source and drain regions 54b and 56b, and a gate electrode 60b. The gate electrode 60b is formed on a gate-insulating layer 58, which is formed on the N-well region 52.

The first and second variable-capacitance elements 50a and 50b operate in response to control voltage signals applied to the gate electrodes 60a and 60b, respectively. The first and second variable-capacitance elements 50a and 50b have different threshold values.

Figure 7A:
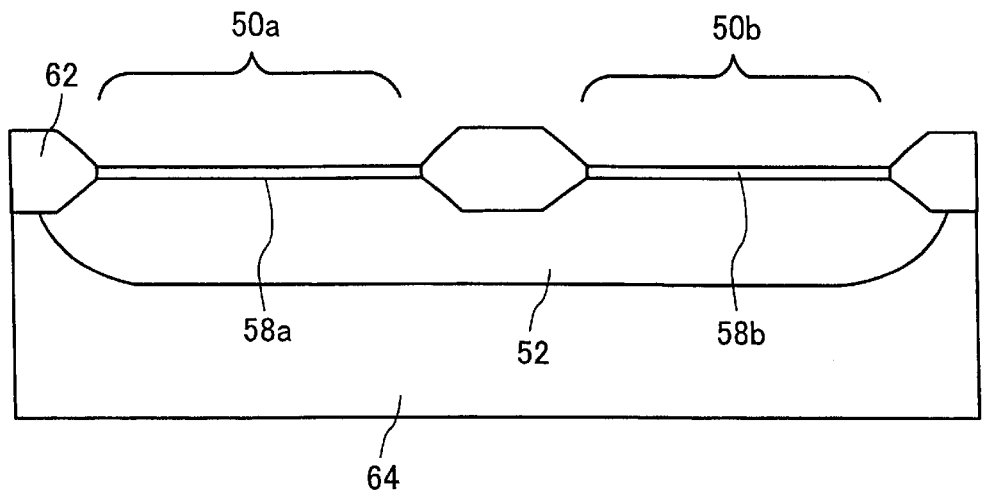
FIGS. 7A to 7D are cross-sectional views showing fabricating steps of the variable-capacitance device shown in FIG. 6.

In fabrication, as shown in FIG. 7A, an N-well region 52 is formed in a P type of semiconductor substrate 64. Next, a field oxide layer 62 is formed on the N-well region 52 to have windows exposed to areas to be used for first and second variable-capacitance elements 50a and 50b. Subsequently, gate insulating layers 58a and 58b are formed on the N-well regions 52.

Figure 7B:
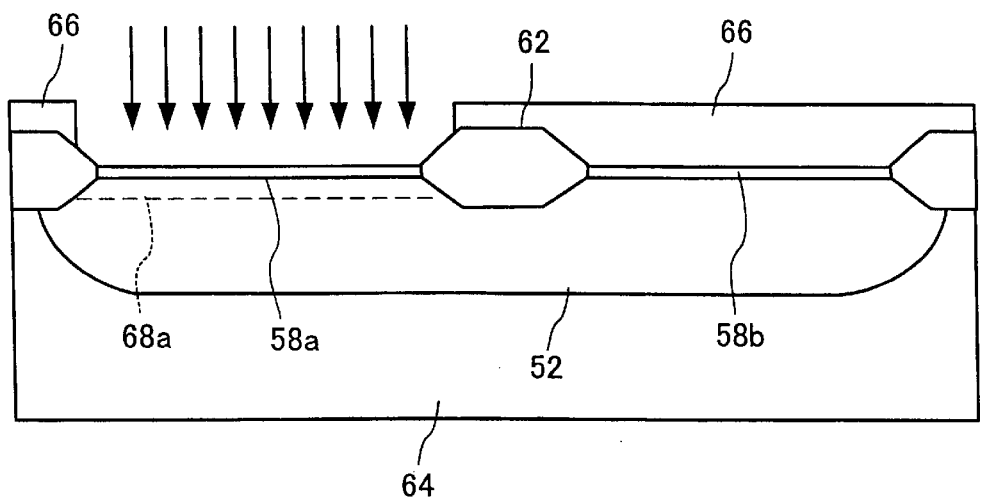

After or before forming the gate insulating layers 58a and 58b, as shown in FIG. 7B, a resist layer 66 is formed on the structure to cover the area to be used for the second variable-capacitance element 50b. Next, boron ions are implanted as impurities into the semiconductor substrate 64 using the resist layer 66 as a mask in order to form a first channel region 68a.

Figure 7C:
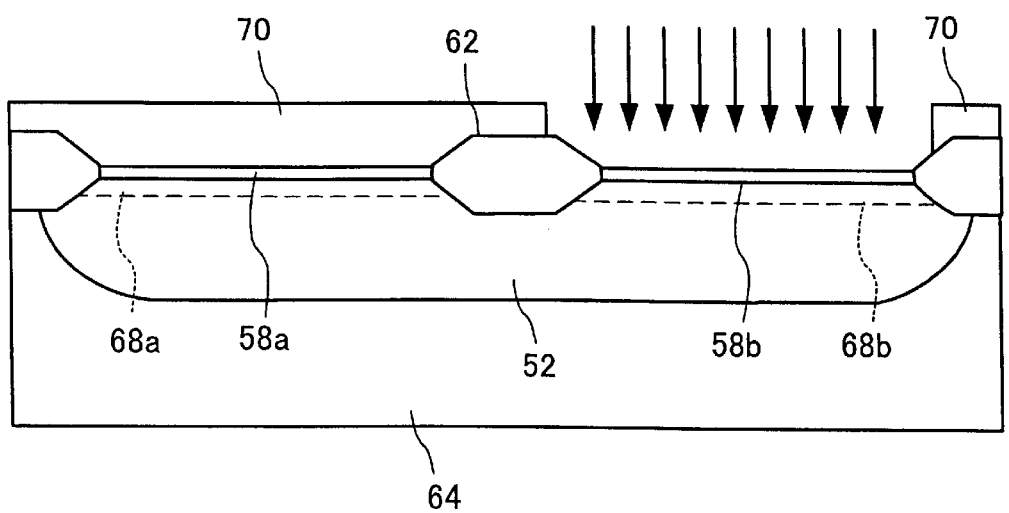

Next, as shown in FIG. 7C, the resist layer 66 is removed and another resist layer 70 is formed on the structure to cover the area to be used for the first variable-capacitance element 50a. Next, boron ions are implanted as impurities into the semiconductor substrate 64 using the resist layer 70 as a mask in order to form a second channel region 68b. The amounts of the boron ions dosed for the first and second channel regions 68a and 68b are different from each other in order to control threshold values of the first and second variable-capacitance elements 50a and 560b.

Figure 7D:
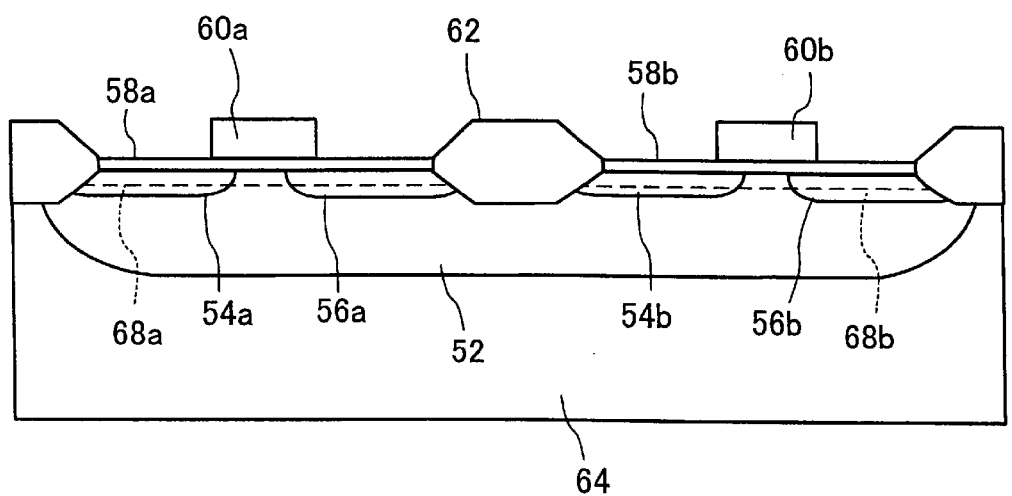

Subsequently, as shown in FIG. 7D, gate electrodes 60a and 60b are formed on the gate insulating layers 58a and 58b, respectively. After that, P type source and drain regions 54a and 56a are formed in the channel region 68a using the gate electrode 60a as a mask. In the same manner, P type source and drain regions 54b and 56b are formed in the channel region 68b using the gate electrode 60b as a mask.

Figure 8:
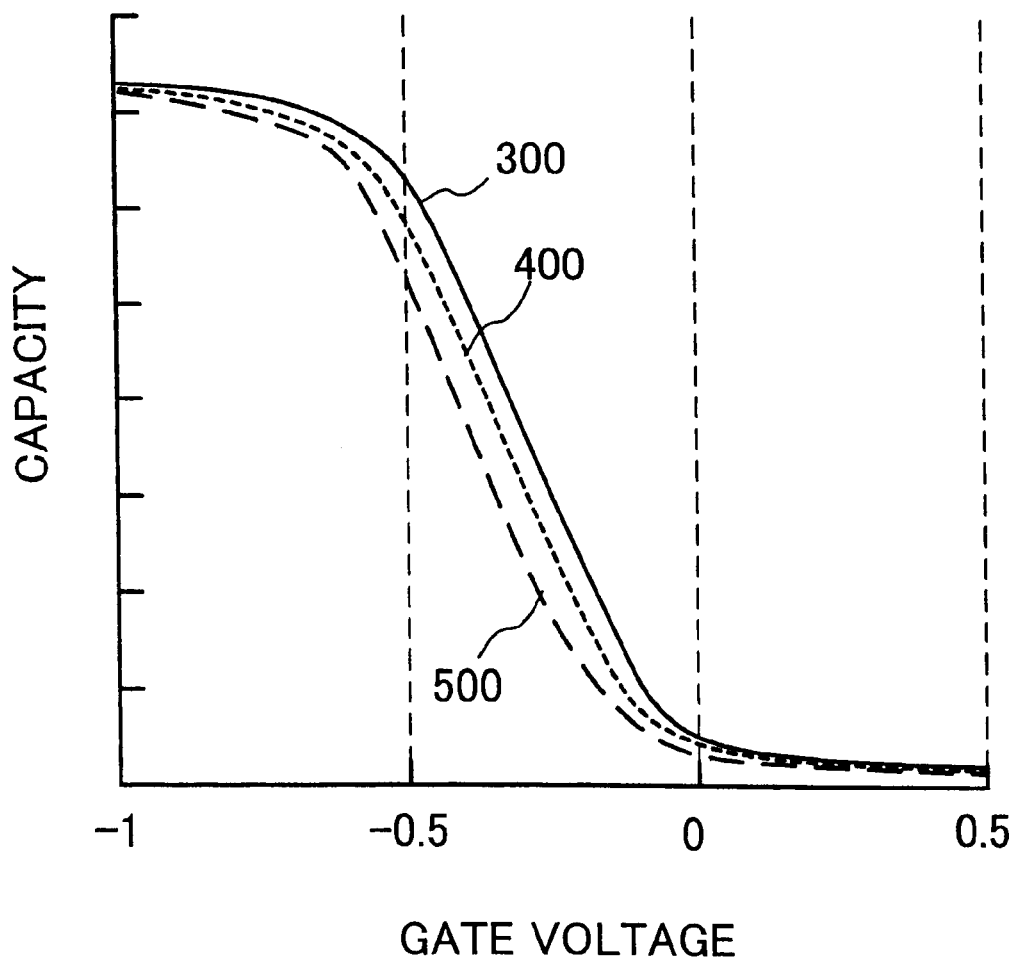
FIGS. 8 and 9 are graphs showing a characteristic of the variable-capacitance device, shown in FIG. 6.

FIG. 8 is a graph showing characteristics of the variable-capacitance device 50, shown in FIG. 6, in which the difference in threshold voltages between the first and second variable-capacitance elements 50a and 50b is 0.1V. In the graph shown in FIG. 8, line 300 indicates variation of capacity with a single variable-capacitance element, having a first threshold voltage, according to conventional technology. The line 500 indicates variation of capacity with another single variable-capacitance element, having a second threshold voltage, which is 0.1V lower than the first threshold voltage.

The line 400 indicates variation of capacity with the variable-capacitance device 50, having the first and second variable-capacitance elements 50a and 50b, of which the difference of the threshold voltages is 0.1V. In the case of lines 400, each elements 50a and 50b has a channel area that is a half of that for the cases of line 300 and 500. In other words, a total channel areas of the first and second variable-capacitance elements 50a and 50b are determined to be the same as that for the conventional variable-capacitance device, shown in FIG. 1 or FIG. 3.

Figure 9:
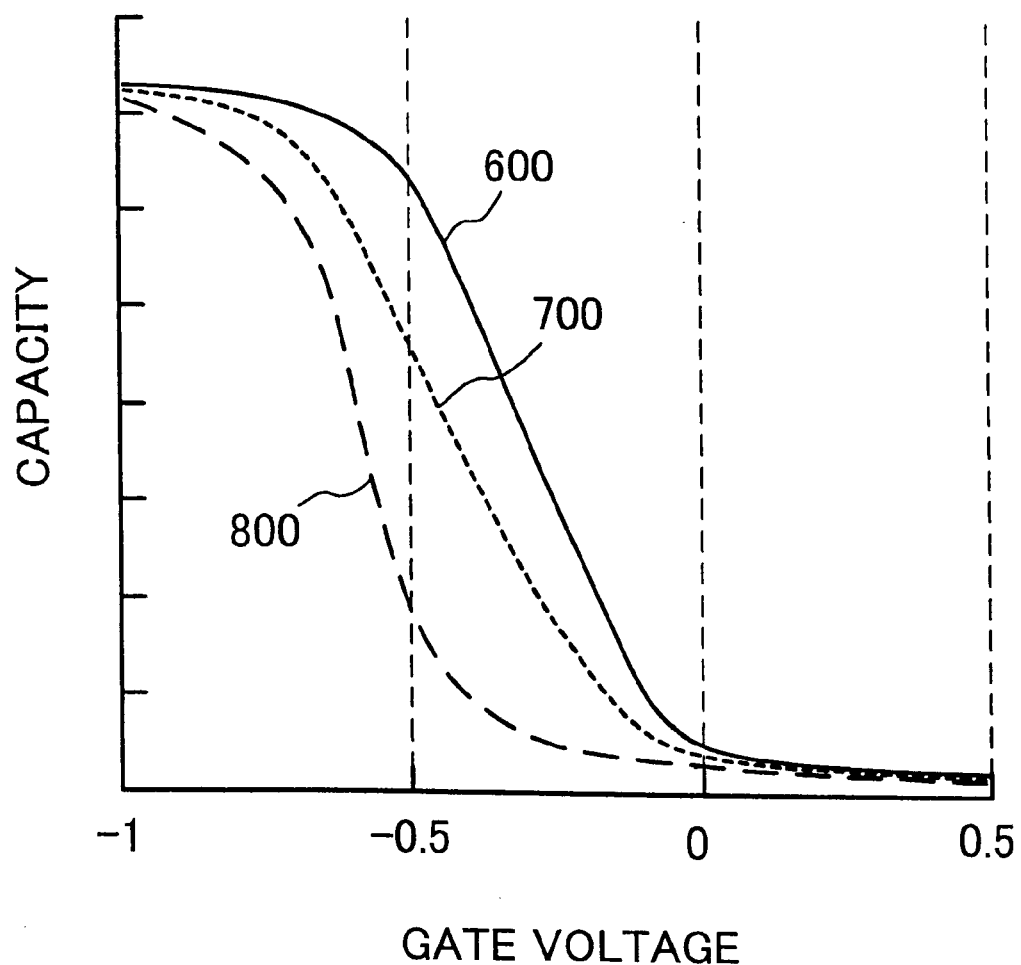

FIG. 9 is a graph showing characteristics of the variable-capacitance device, shown in FIG. 6, in which the difference in threshold voltages between the first and second variable-capacitance elements 50a and 50b is 0.3V. In the graph shown in FIG. 9, line 600 indicates variation of capacity with a single variable-capacitance element, having a first threshold voltage. The line 800 indicates variation of capacity with another single variable-capacitance element, having a second threshold voltage, which is 0.3V lower than the first threshold voltage.

The line 700 indicates variation of capacity with the variable-capacitance device 50, having the first and second variable-capacitance elements 50a and 50b, of which the difference of the threshold voltages is 0.3V. In the case of lines 700, each elements 50a and 50b has a channel area that is a half of that for the case of line 600 and 800. In other words, a total channel areas of the first and second variable-capacitance elements 50a and 50b are determined to be the same as that for the conventional variable-capacitance device, shown in FIG. 1 or FIG. 3.

As shown in FIGS. 8 and 9, when the difference of threshold voltages between the first and second variable-capacitance elements 50a and 50b is larger, the gradient (rate of change) of variable capacity is steep. According to the first preferred embodiment, the gradient (rate of change) of variable capacity relative to gate voltages can be controlled without change of variable range.

Figure 10:
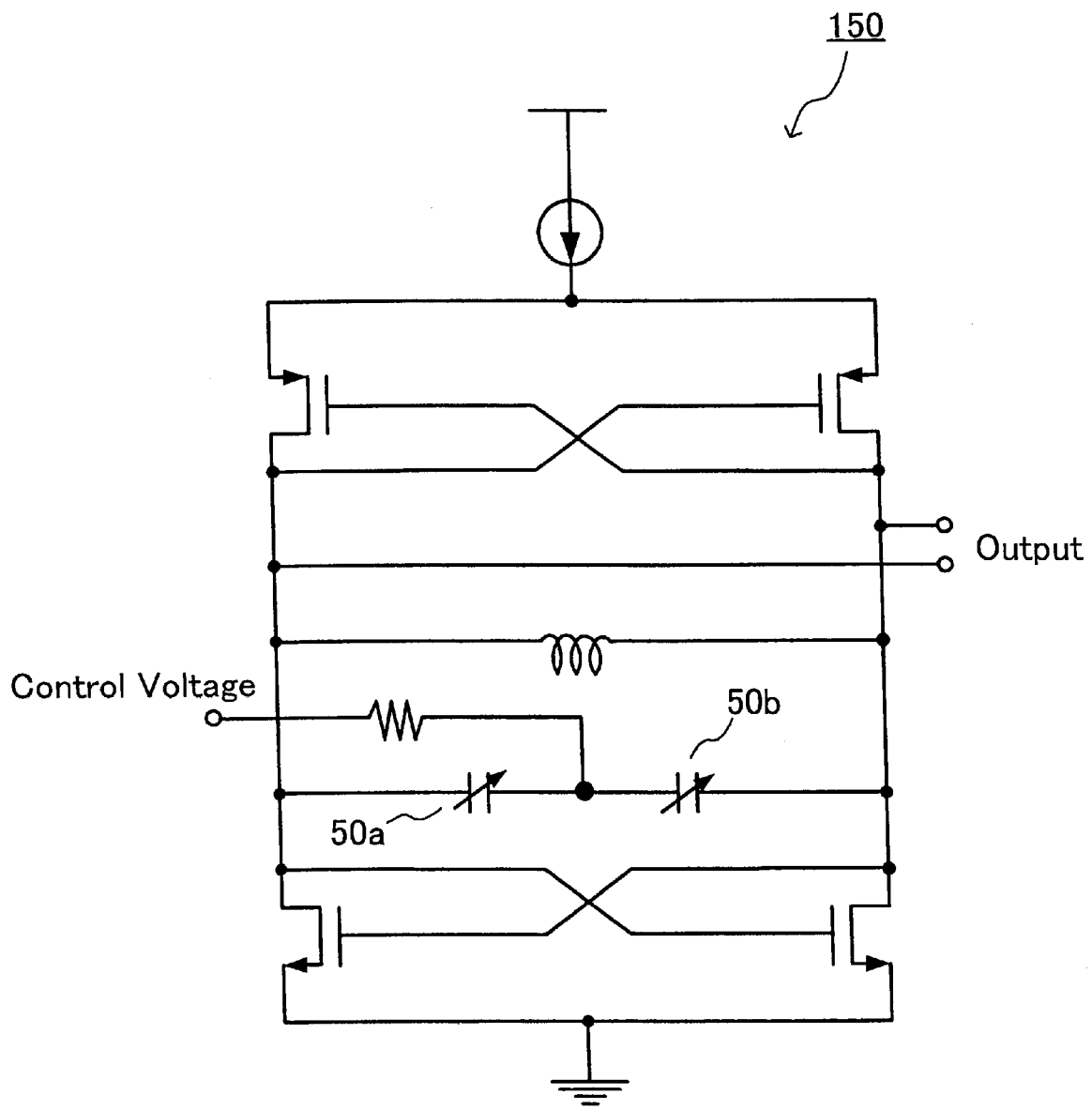
FIG. 10 is a circuit diagram showing a voltage-controlled oscillator using the device, shown in FIG. 6.

FIG. 10 is a circuit diagram showing a voltage-controlled oscillator 150 using the variable-capacitance device, shown in FIG. 6. As shown in FIG. 10, the voltage-controlled oscillator 150 includes variable-capacitance elements 50a and 50b, which are connected in parallel. The variable-capacitance elements 50a and 50b form the variable-capacitance device 50, shown in FIG. 6.

Figure 11:
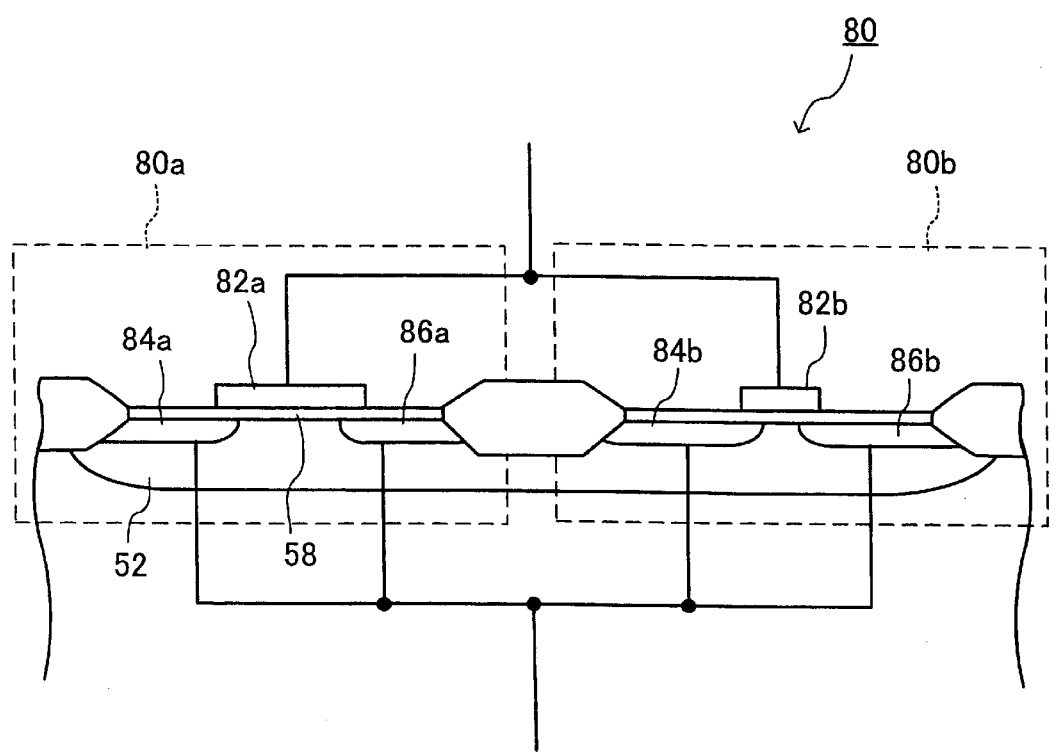
FIG. 11 is a cross-sectional view showing a variable-capacitance device according to a second preferred embodiment of the present invention.

FIG. 11 shows a variable-capacitance device 80 according to a second preferred embodiment of the present invention. The variable-capacitance device 80 includes first and second variable-capacitance elements 80a and 80b, which are connected in parallel to each other. Each of the first and second variable-capacitance elements 80a and 80b is of MOS-transistor type. In FIG. 11, the same or corresponding elements to those in the first preferred embodiment are represented by the same reference numerals and the same description is not repeated.

The first variable-capacitance element 80a includes a N-well region 52 formed in a P-type semiconductor substrate, P+ type of source and drain regions 84a and 86a, and a gate electrode 82a. The gate electrode 82a is formed on a gate-insulating layer 58, which is formed on the N-well region 52.

The second variable-capacitance element 80b includes the N-well region 52, which is commonly used with the first variable-capacitance element 80a, P+ type of source and drain regions 84b and 86b, and a gate electrode 82b. The gate electrode 82b is formed on a gate-insulating layer 58, which is formed on the N-well region 52.

The first and second variable-capacitance elements 80a and 80b operate in response to control voltage signals applied to the gate electrodes 82a and 82b, respectively. The first and second variable-capacitance elements 80a and 80b have different threshold values. The difference of the threshold voltages between the first and second variable-capacitance elements 80a and 80b are made by controlling the lengths of the gate electrodes 82a and 82b, shown in FIG. 11.

According to the second preferred embodiment, the threshold voltages can be adjusted with simple fabrication steps as compared to the first preferred embodiment, shown in FIG. 6.

What is claimed is:

1. A variable-capacitance device, comprising:

a first variable-capacitance element, which comprises gate, source and drain regions and operates in response to a control voltage applied to the gate region; and a second variable-capacitance element, which comprises gate, source and drain regions and operates in response to a control voltage applied to the gate region;

wherein the first and second variable-capacitance elements are connected in parallel to each other, and the first and second variable-capacitance elements have different levels of threshold values.

2. A variable-capacitance device, according to claim 1, wherein the first and second variable-capacitance elements are formed by fabrication steps comprising implanting impurities into a semiconductor substrate, and the threshold values of the first and second variable-capacitance elements are adjusted by controlling an amount of impurities to be implanted into the semiconductor substrate.

3. A variable-capacitance device, according to claim 1, the threshold values of the first and second variable-capacitance elements are adjusted by controlling lengths of the gate regions.

4. A voltage-controlled oscillator comprising a variable-capacitance device according to claim 1.

5. A voltage-controlled oscillator according to claim 4, wherein the first and second variable-capacitance elements are formed by fabrication steps comprising implanting impurities into a semiconductor substrate, and the threshold values of the first and second variable-capacitance elements are adjusted by controlling an amount of impurities to be implanted into the semiconductor substrate.

6. A voltage-controlled oscillator according to claim 4, wherein the threshold values of the first and second variable-capacitance elements are adjusted by controlling lengths of the gate regions.

* * * * *